United States Patent
Kitamura et al.

(10) Patent No.: US 9,779,954 B2
(45) Date of Patent: Oct. 3, 2017

(54) METHOD FOR ETCHING SILICON LAYER AND PLASMA PROCESSING APPARATUS

(71) Applicant: TOKYO ELECTRON LIMITED, Tokyo (JP)

(72) Inventors: Akinori Kitamura, Miyagi (JP); Eiji Suzuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/557,659

(22) Filed: Dec. 2, 2014

(65) Prior Publication Data
US 2015/0162203 A1    Jun. 11, 2015

(30) Foreign Application Priority Data
Dec. 11, 2013  (JP) .................................. 2013-256041

(51) Int. Cl.
   *H01L 21/3065*  (2006.01)
   *H01L 21/02*    (2006.01)
   *H01L 21/311*   (2006.01)
   *H01J 37/32*    (2006.01)

(52) U.S. Cl.
   CPC .... *H01L 21/3065* (2013.01); *H01J 37/32192* (2013.01); *H01J 37/32449* (2013.01); *H01L 21/02057* (2013.01); *H01L 21/31116* (2013.01)

(58) Field of Classification Search
   CPC ............. H01L 21/3065; H01L 21/3085; H01L 21/311; H01L 21/32136; H01L 21/02057; H01L 21/31116; H01J 37/32449; H01J 37/32192
   See application file for complete search history.

(56) References Cited

U.S. PATENT DOCUMENTS

| | | | |
|---|---|---|---|
| 6,406,999 B1* | 6/2002 | Esry | H01L 21/31116 257/E21.252 |
| 2002/0072016 A1* | 6/2002 | Chen et al. | 430/323 |
| 2005/0101126 A1* | 5/2005 | Wagganer et al. | 438/637 |
| 2005/0103748 A1* | 5/2005 | Yamaguchi et al. | 216/67 |
| 2007/0090093 A1* | 4/2007 | Kitamura et al. | 216/67 |
| 2011/0201208 A1* | 8/2011 | Kawakami | H01L 21/31116 438/714 |
| 2012/0064726 A1* | 3/2012 | Nozawa | H01J 37/32192 438/710 |
| 2013/0093321 A1* | 4/2013 | Yoshikawa | H01J 37/32192 315/39 |

FOREIGN PATENT DOCUMENTS

| | | |
|---|---|---|
| JP | 5-283377 A | 10/1993 |
| JP | 6-188226 A | 7/1994 |
| JP | 2011-155242 A | 8/2011 |

\* cited by examiner

*Primary Examiner* — Yuechuan Yu
(74) *Attorney, Agent, or Firm* — Rothwell, Figg, Ernst & Manbeck, P.C.

(57) ABSTRACT

Disclosed is a method of etching a silicon layer by removing an oxide film formed on a workpiece which includes the silicon layer and a mask provided on the silicon layer. The method includes: (a) forming a denatured region by generating plasma of a first processing gas containing hydrogen, nitrogen, and fluorine within a processing container accommodating the workpiece therein to denature an oxide film formed on a surface of the workpiece; (b1) removing the denatured region by generating plasma of a rare gas within the processing container; and (c) etching the silicon layer by generating plasma of a second processing gas within the processing container.

7 Claims, 12 Drawing Sheets

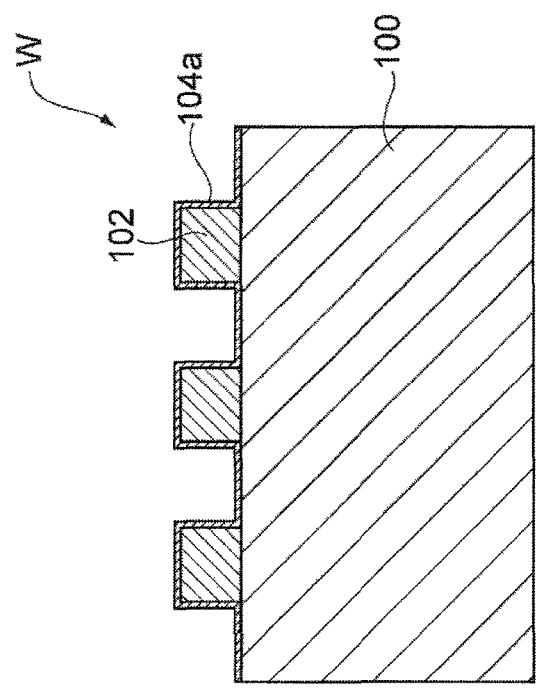
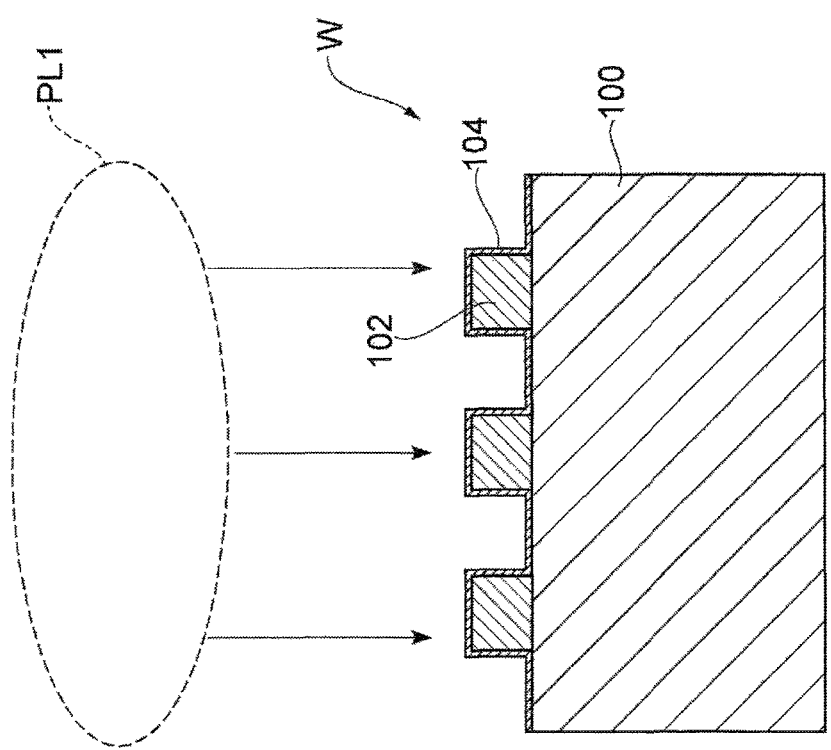
FIG.3A
FIG.3B

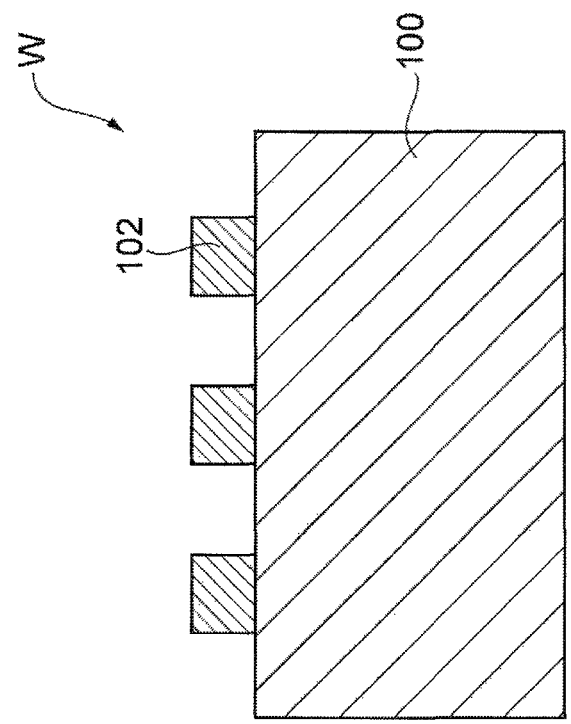
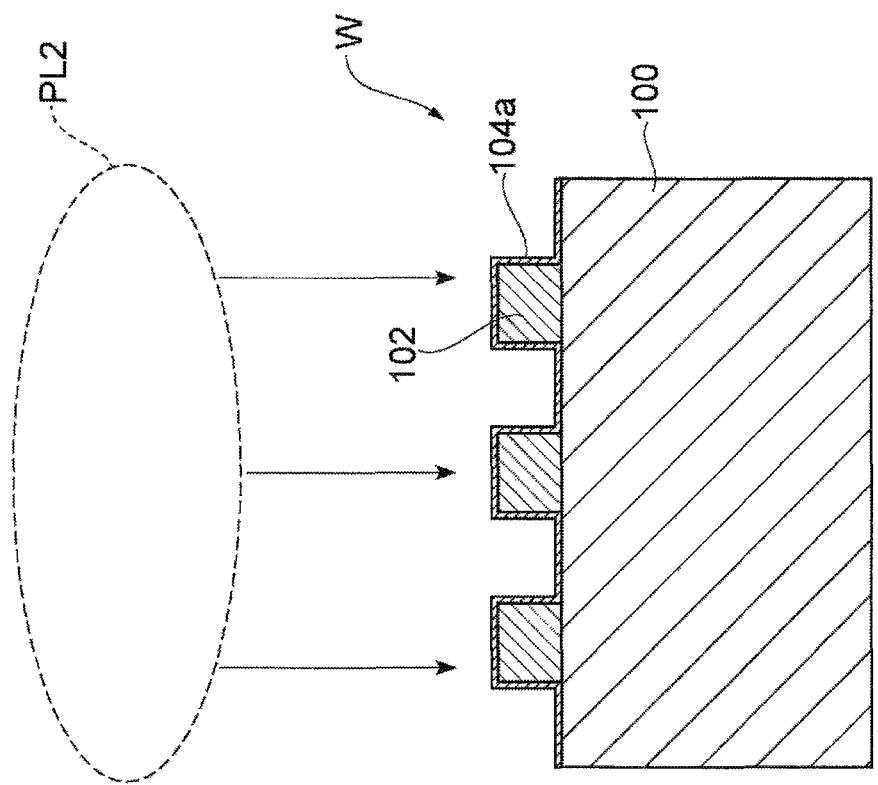
FIG.4A
FIG.4B

METHOD FOR ETCHING SILICON LAYER AND PLASMA PROCESSING APPARATUS

CROSS-REFERENCE TO RELATED APPLICATIONS

This application is based on and claims priority from Japanese Patent Application No. 2013-256041, filed on Dec. 11, 2013, with the Japan Patent Office, the disclosure of which is incorporated herein in its entirety by reference.

TECHNICAL FIELD

Exemplary embodiments of the present disclosure relate to a method for etching a silicon layer and a plasma processing apparatus.

BACKGROUND

In manufacturing an electronic device such as, for example, a fin type field effect transistor, a plasma etching is performed so as to transfer a pattern of a mask to a silicon layer. In some cases, since a natural oxide film is formed on an object to be processed ("workpiece") including the silicon layer and the mask, the plasma etching of the silicon layer may be performed after removing the natural oxide film. Typically, the natural oxide film is removed by exposing the workpiece to the plasma of a fluorocarbon-based gas.

When removing an oxide film such as the natural oxide film, it is required to selectively remove the oxide film with respect to the silicon layer and the mask. A method called chemical oxide removal (COR) is known as a method for selectively removing the oxide film. In the COR, the workpiece is exposed to a processing gas including hydrogen, nitrogen, and fluorine. As a result, silicon oxide forming the oxide film is denatured to $(NH_4)_2SiF_6$, i.e., ammonium fluorosilicate, thereby forming a denatured region. Subsequently, in the COR, the workpiece is heated so that the ammonium fluorosilicate of the converted region is thermally decomposed. Therefore, the oxide film is removed.

In some cases, the denatured region may also be formed by a plasma processing. That is, the denatured region may be formed when the workpiece is exposed to the plasma of the processing gas. The COR using plasma is disclosed in Japanese Laid-Open Patent Publication No. H6-188226.

SUMMARY

According to an aspect of the present disclosure, there is provided a method of etching a silicon layer by removing an oxide film formed on an object to be processed ("workpiece") which includes the silicon layer and a mask provided on the silicon layer. The method includes: (a) forming a denatured region by generating plasma of a first processing gas containing hydrogen, nitrogen, and fluorine within a processing container accommodating the workpiece therein to denature an oxide film formed on a surface of the workpiece; (b1) removing the denatured region by generating plasma of a rare gas within the processing container; and (c) etching the silicon layer generating plasma of a second processing gas within the processing container.

The foregoing summary is illustrative only and is not intended to be in any way limiting. In addition to the illustrative aspects, embodiments, and features described above, further aspects, exemplary embodiments, and features will become apparent by reference to the drawings and the following detailed description.

BRIEF DESCRIPTION OF THE DRAWINGS

FIGS. 3A and 3B are views for describing step ST1 of the method illustrated in FIG. 1.

FIGS. 4A and 4B are views for describing step ST2 of the method illustrated in FIG. 1.

DETAILED DESCRIPTION

Figure 1:
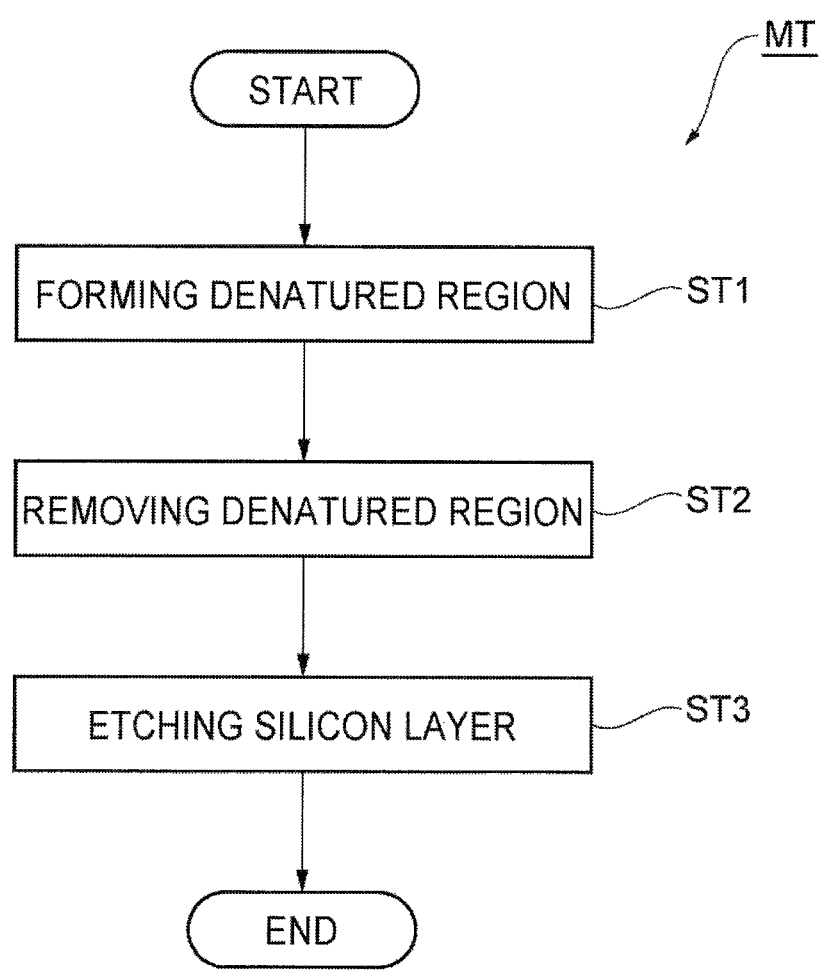
FIG. 1 is a flowchart illustrating an exemplary embodiment of a method for etching a silicon layer.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the COR, after the denatured region is formed in the plasma processing apparatus, the workpiece is conveyed to a heating apparatus different from the plasma processing apparatus. Accordingly, the number of steps required up to the etching of the silicon layer is increased.

Accordingly, it is required to remove the oxide film with a high throughput in a pretreatment of the etching of the silicon layer.

In a first aspect of the present disclosure, there is provided a method of etching a silicon layer by removing an oxide film formed on an object to be processed ("workpiece") which includes the silicon layer and a mask provided on the silicon layer. The method includes: (a) forming a denatured region by generating plasma of a first processing gas containing hydrogen, nitrogen, and fluorine within a processing container accommodating the workpiece therein to denature an oxide film formed on a surface of the workpiece; (b1) removing the denatured region by generating plasma of a rare gas within the processing container; and (c) etching the silicon layer generating plasma of a second processing gas within the processing container.

In the method of the first aspect, in step (b1), the denatured region may be removed by the plasma of the rare gas. In addition, steps (a), (b1) and (c) may be performed in a single processing container. Accordingly, the oxide film may be removed with a high throughput in a pretreatment of the etching of the silicon layer.

In a second aspect of the present disclosure, there is provided a method of etching a silicon layer by removing an oxide film formed on a workpiece which includes the silicon layer and a mask provided on the silicon layer. The method includes: (a) forming a denatured region by generating plasma of a first processing gas containing hydrogen, nitrogen, and fluorine within a processing container accommodating the workpiece therein to denature an oxide film; (b2) removing the denatured region by generating plasma of a second processing gas within the processing container following to forming the denatured region without taking out the workpiece from the processing container; and (c) etching the silicon layer by generating plasma of the second processing gas within the processing container.

According to the method of the second aspect, the denatured region may be removed by the plasma of the second processing gas used in steps (b2) and (c). That is, the removing of the denatured region and the etching of the silicon layer may be performed successively without changing the gas species. In addition, steps (a), (b2) and (c) may be performed in a single processing container. Accordingly, the oxide film may be removed with a high throughput in a pretreatment of the etching of the silicon layer.

In an exemplary embodiment of the first and second aspects, the step of forming the denatured region and the step of removing the denatured region may be performed in a biasless manner. With this exemplary embodiment, the damage of the silicon layer and the mask can be suppressed.

In an exemplary embodiment of the first and second aspects, the first processing gas may include $SF_6$ gas.

In a third aspect of the present disclosure, there is provided a plasma processing apparatus which may be used for performing the method according to the first aspect. The plasma processing apparatus is provided with a processing container, a mounting table, a gas supply module, a plasma generation unit, and a control unit. The mounting table is configured to mount an object to be processed ("workpiece") thereon within the processing container. The gas supply module is configured to supply a first gas containing hydrogen, nitrogen and fluorine, a rare gas, and a second processing gas for etching a silicon layer into the processing container. The plasma generation unit is configured to generate energy to excite a gas supplied into the processing container. The control unit is configured to control the gas supply module and the plasma generation unit. The control unit executes: a first control of causing the gas supply module to supply the first processing gas, and causing the plasma generation unit to generate energy, a second control of causing the gas supply module to supply the rare gas, and causing the plasma generation unit to generate energy, and a third control of causing the gas supply module to supply the second processing gas, and causing the plasma generation unit to generate energy.

In an exemplary embodiment of the third aspect, a bias power may not be supplied to the mounting table during the first control and the second control.

In the fourth aspect of the present disclosure, there is provided a plasma processing apparatus which may be used for performing the method according to the second aspect. The plasma processing apparatus is provided with a processing container, a mounting table, a gas supply module, a plasma generation unit, and a control unit. The mounting table is configured to mount a workpiece thereon within the processing container. The gas supply module is configured to supply a first gas containing hydrogen, nitrogen and fluorine, and a second processing gas for etching a silicon layer into the processing container. The plasma generation unit is configured to generate energy to excite a gas supplied into the processing container. The control unit configured to control the gas supply module and the plasma generation unit. The control unit executes: a first control of causing the gas supply module to supply the first processing gas, and causing the plasma generation unit to generate energy, and a second control of causing the gas supply module to supply the second processing gas, and causing the plasma generation unit to generate energy, following to the first control. According to this plasma processing apparatus, the denatured region is removed in the second control, and subsequently, the silicon is etched.

In an exemplary embodiment of the fourth aspect, the bias power may not be supplied to the mounting table during the first control and a predetermined period from initiation of the second control, and the bias power may be supplied to the mounting table after the predetermined period from the initiation of the second control.

In addition, in an exemplary embodiment of the third and fourth aspects, the first processing gas may include $SF_6$ gas.

As described above, the oxide film may be removed with a high throughput in a pretreatment of the etching of the silicon layer.

Hereinafter, various exemplary embodiments will be described with reference to the accompanying drawings. In the accompanying drawings, the same or corresponding components will be denoted by the same reference symbols, respectively.

Figure 2:
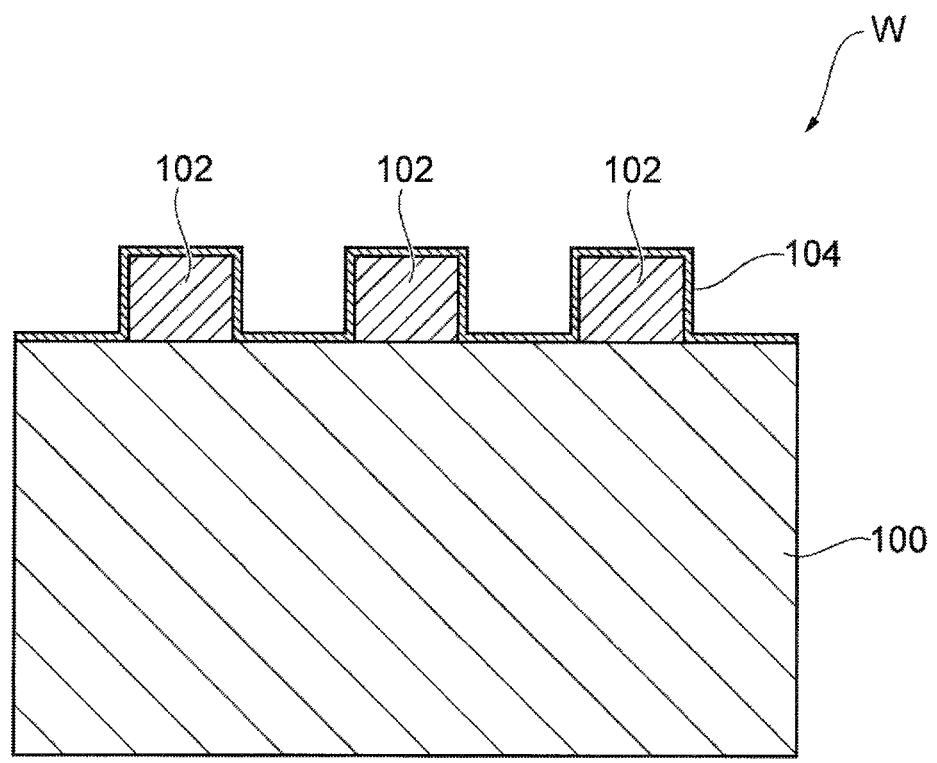
FIG. 2 is a cross-sectional view illustrating an exemplary workpiece.

FIG. 1 is a flowchart illustrating an exemplary embodiment of a method for etching a silicon layer. Method MT illustrated in FIG. 1 is a method for etching a silicon layer by removing an oxide film from a workpiece (hereinafter, referred to as a "wafer W"). The method may be applied to a wafer W illustrated in FIG. 2. FIG. 2 is a cross-sectional view illustrating an exemplary workpiece to which method MT is applicable. The wafer W illustrated in FIG. 2 is a product obtained in the middle of manufacturing the fin type field effect transistor, for example, a product obtained in a step prior to forming a dummy gate which is made of silicon.

As illustrated in FIG. 2, the wafer W includes a silicon layer 100 and a mask 102. The silicon layer 100 is formed of, for example, polycrystalline silicon. The mask 102 is mounted on the silicon layer 100. The mask 102 is formed of, for example, SiN. In some cases, an oxide film 104 such as a natural oxide film may be formed on the surface of the wafer W in a step prior to etching the silicon layer 100. In method MT and a method according to another exemplary embodiment to be described later, the oxide film 104 may be removed so as to etch the silicon layer 100. Meanwhile, a workpiece, to which methods according to various exemplary embodiments disclosed herein is applicable, is not limited to the wafer W illustrated in FIG. 2. The methods may be applied to any workpiece as long as the workpiece includes a mask installed on a silicon layer and an oxide film is formed on the surface of the silicon layer in a step prior to etching the silicon layer. Hereinafter, descriptions will be made on method MT with reference to the wafer W of FIG. 2 as an example.

Reference will be made to FIG. 1 again. In addition, in the following description, FIGS. 3A and 3B, 4A and 4B, and 5A and 5B will be properly referred. As illustrated in FIG. 1, in method MT, step ST1 is performed first. In step ST1, as illustrated in FIGS. 3A and 3B, the oxide film 104 is denatured to form a denatured region 104a. As illustrated in FIG. 3A, in step ST1, plasma PL1 of first processing gas is generated in a processing container which accommodates the wafer W therein. In step ST1, the wafer W is exposed to the plasma PL1.

The first processing gas contains hydrogen, nitrogen, and fluorine. In an exemplary embodiment, the first processing gas may include $H_2$ gas as a hydrogen source, and $N_2$ gas as a nitrogen source. In addition, the first processing gas may include at least one of a fluorocarbon gas, a fluorohydrocarbon gas, $NF_3$ gas, and $SF_6$ gas as a fluorine source. As the fluorocarbon gas, $CF_4$ gas, $C_4F_8$ gas, $C_5F_8$ gas, and $C_4F_6$ gas may be exemplified. In addition, as the fluorohydrocarbon gas, $CHF_3$ gas, $CH_2F_2$ gas, and $CH_3F$ may be exemplified.

In step ST1, the plasma of the first processing gas may be generated by any plasma source. For example, the first processing gas may be excited by microwaves, may be excited by a capacitively coupled plasma source, or may be excited by an inductively coupled plasma source. Meanwhile, as in step ST1, any other plasma source may be used in steps ST2 and ST3 to be described later.

In step ST1, the pressure within the processing container may be set to be in a range of 40 Pa (300 mTorr) to 66.66 Pa (500 mTorr). In addition, in step ST1, the first processing gas may include $N_2$ gas, and the flow rate of $N_2$ may be set to be in a range of 300 sccm to 1000 sccm. Further, in step ST1, the first processing gas may include $SF_6$ gas, and the portion occupied by the flow rate of $SF_6$ in the entire flow rate of the first processing gas may be set to be in a range of 3% to 8%. In an exemplary embodiment, step ST1, and steps ST2 and ST3 to be described later are performed in a plasma processing apparatus which excites a gas using microwaves. In step ST1 of the present exemplary embodiment, the power of microwaves may be set to be in a range of 800 W to 3000 W.

In step ST1, a bias power for drawing ions in the plasma into the wafer W may not be used. That is, step ST1 may be performed in a biasless manner. When step ST1 is performed in the biasless manner, damage of the wafer caused by an ion sputtering effect may be suppressed. In particular, deformation of the mask 102 may be suppressed.

When the wafer W is exposed to the plasma PL1 of the first processing gas, the silicon oxide of the oxide film 104 is denatured so that the oxide film 104 is turned into a denatured region 104a as illustrated in FIG. 3B. Specifically, hydrogen, nitrogen, and fluorine included in the first processing gas and the silicon oxide of the oxide film 104 are reacted with each other. As a result, the silicon oxide is denatured into $(NH_4)_2SiF_6$, i.e. ammonium fluorosilicate.

Subsequently, in method MT, step ST2 is performed. In step ST2, the denatured region 104a formed in step ST1 is removed. Step ST2 is performed within the processing container used in step ST1 without taking out the wafer W from the corresponding processing container. In step ST2 of an exemplary embodiment, plasma PL2 of a rare gas is generated within the processing container as illustrated in FIG. 4A. As for the rare gas, any rare gas such as, for example, Ar gas, Xe gas, Ne gas, or Kr gas may be used. In step ST2, the wafer W is exposed to the plasma PL2. Thus, the denatured region 104a is removed and the wafer W is turned into the state illustrated in FIG. 4B.

In step ST2, a bias power for drawing ions in the plasma into the wafer W may not be used. That is, step ST2 may be performed in a biasless manner. When step ST2 is performed in the biasless manner, damage of the wafer caused by an ion sputtering effect may be suppressed. In particular, deformation of the mask 102 may be suppressed.

Figure 5:
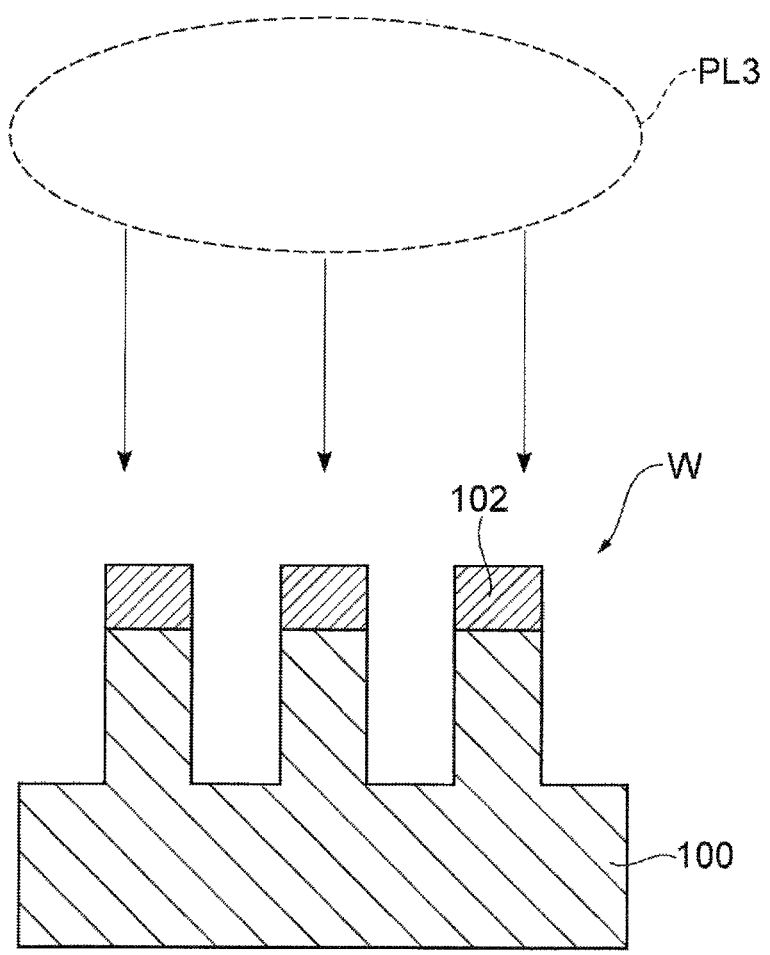
FIG. 5 is a view for describing step ST3 of the method illustrated in FIG. 1.

Subsequently step ST3 is performed in method MT. In step ST3, the silicon layer 100 is etched. Step ST3 is performed with the processing container used in steps ST1 and ST2 without taking out the wafer from the processing container. As illustrated in FIG. 5, in step ST3, plasma PL3 of a second processing gas is generated. The second processing gas includes, for example, HBr gas. In addition, the second processing gas may further include a rare gas and oxygen gas. In step ST3, the wafer W is exposed to the plasma PL3. As a result, the silicon layer 100 is etched and the pattern of the mask 102 is transferred to the silicon layer 100. Meanwhile, a bias power may be used in step ST3. By the bias power, ions are drawn into the wafer W. As a result, a verticality of a shape formed by etching the silicon layer 100 may be improved.

According to method MT, in step ST2, the denatured region 104a may be removed with the plasma of the rare gas. In addition, steps ST1, ST2, and ST3 may be formed within a single processing container. Accordingly, the oxide film 104 may be removed with a high throughput in the pretreatment of the etching of the silicon layer 100. As a result, the throughput of a series of processings including the removal of the oxide film 104 and the etching of the silicon layer 100 may be improved.

Hereinafter, descriptions will be made on a method according to another exemplary embodiment. The method according to another exemplary embodiment includes steps ST1 and ST3 which are equal to steps ST1 and ST3 of method MT. Step ST2 of the method according to the present exemplary embodiment generates plasma of the second processing gas unlike method MT.

Figure 6A:
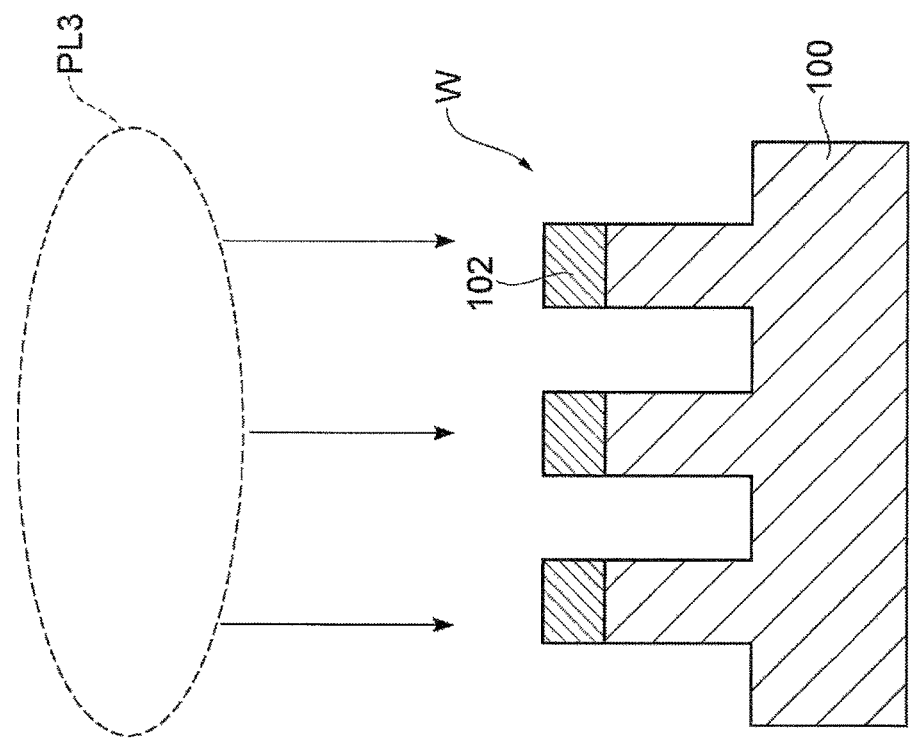
FIGS. 6A and 6B are views for describing steps ST2 and ST3 of a method according to another exemplary embodiment.
Figure 6B:
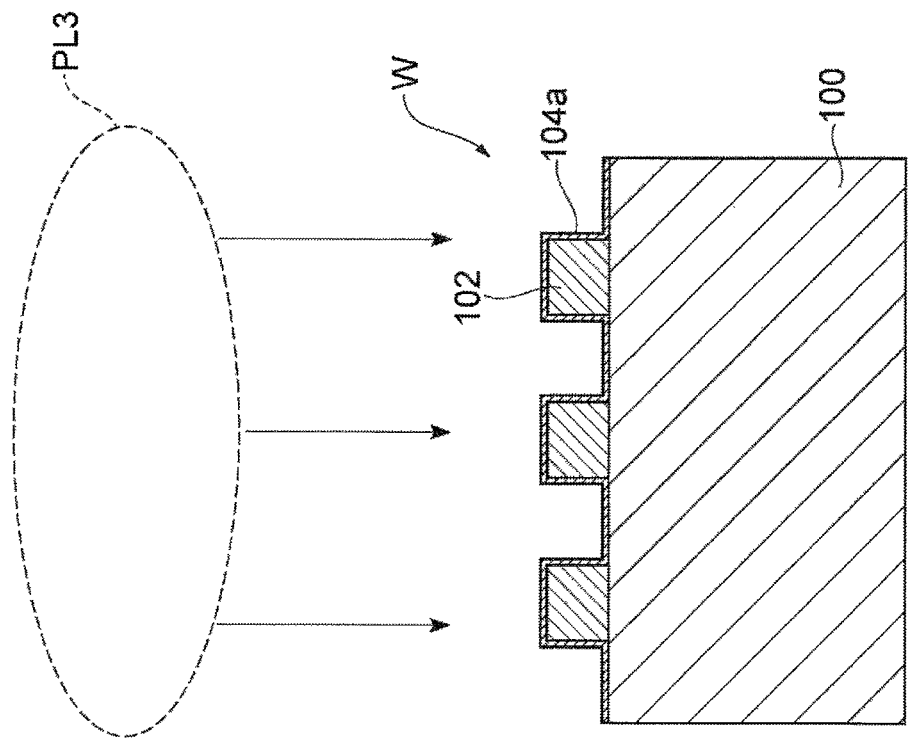

That is, in step ST2 of the method according to the present exemplary embodiment, the wafer W is exposed to the plasma PL3 of the second processing gas for etching the silicon layer 100 as illustrated in FIG. 6A. As a result, the denatured region 104a is removed. In addition, in succession to step ST2, the plasma PL3 is generated in step ST3 so that the silicon layer 100 is etched as illustrated in FIG. 6B. Meanwhile, step ST2 may be performed in a biasless manner and in step ST3, a bias power for ion drawing-in may be supplied. In this manner, the plasma of the second processing gas may be continuously used for both the removal of the denatured region 104a and the etching of the silicon layer 100. Thus, according to the present exemplary embodiment, switching of gases between step ST2 and step ST3 may be omitted.

Figure 7:
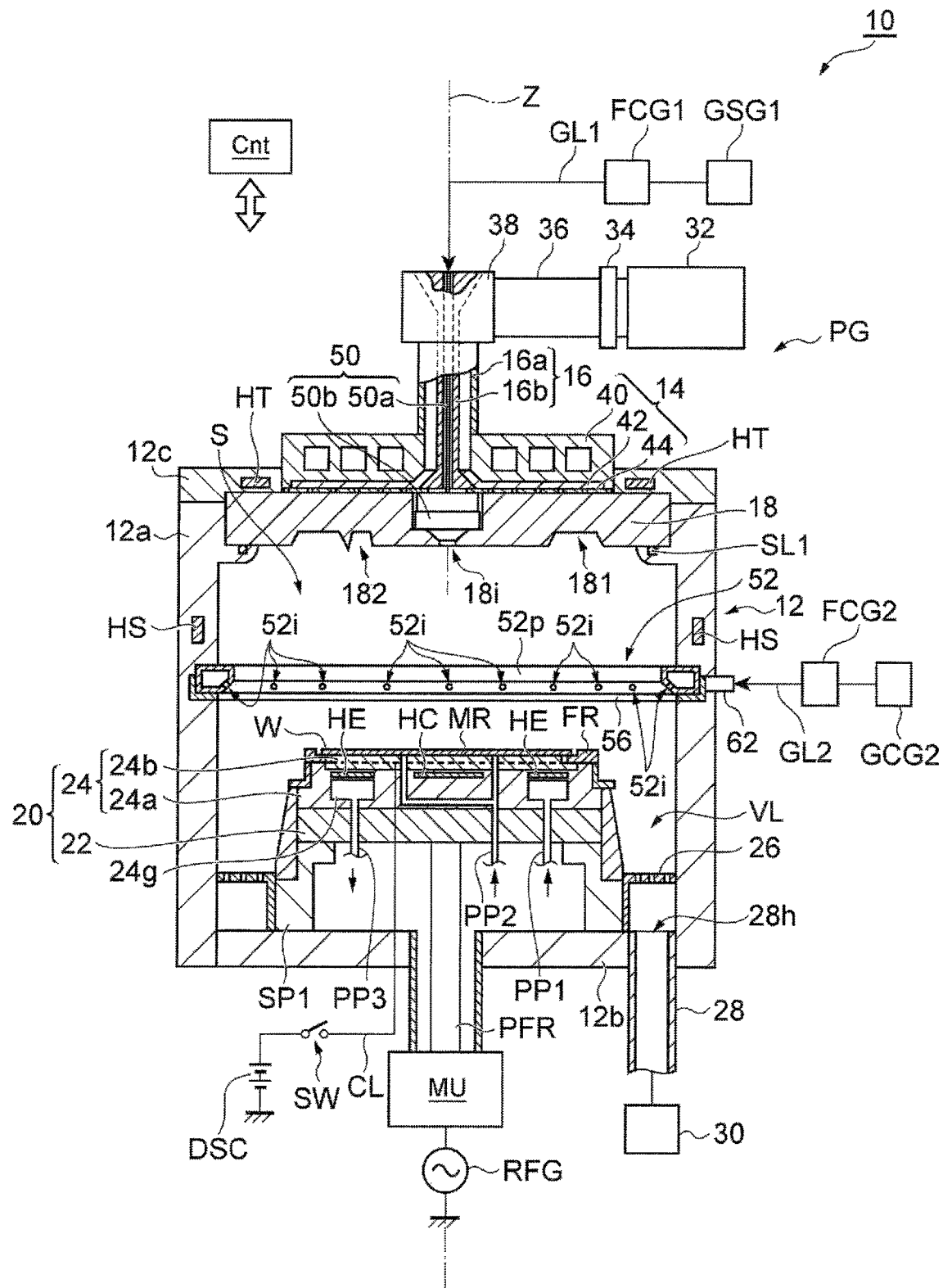
FIG. 7 is a cross-sectional view schematically illustrating a plasma processing apparatus according to an exemplary embodiment.

Hereinafter, descriptions will be made on a plasma processing apparatus which may be used for the above-described methods according to various exemplary embodiments. FIG. 7 is a cross-sectional view schematically illustrating a plasma processing apparatus according to an exemplary embodiment.

The plasma processing apparatus 10 illustrated in FIG. 7 is provided with a processing container 12. The processing container 12 defines a processing space S configured to accommodate a wafer W therein. The processing container 12 may include a side wall 12a, a bottom portion 12b, and a ceiling portion 12c.

The side wall 12a has a substantially cylindrical shape substantially centering around the axis Z and extending in the direction where an axis Z extends (hereinafter, referred to as an "axis Z direction"). The inner diameter of the side wall 12a is, for example, 540 mm. The bottom portion 12b is formed at a lower end side of the side wall 12a. The upper end of the side wall 12a is opened. The opening of the upper end of the side wall 12a is closed by a dielectric window 18. The dielectric window 18 is sandwiched between the upper end of the side wall 12a and the ceiling portion 12c. A sealing member SL1 may be interposed between the dielectric window 18 and the upper end of the side wall 12a. The sealing member SL1 is, for example, an O-ring and contributes to the hermetic sealing of the processing container 12.

The plasma processing apparatus 10 further includes a mounting table 20. The mounting table 20 is installed within the processing container 12 and below the dielectric window 18. The mounting table 20 includes a plate 22 and an electrostatic chuck 24.

The plate 22 is a metallic member having substantially a disc shape, and is formed of, for example, aluminum. The plate 22 is supported by a cylindrical support unit SP1. The support unit SP1 extends vertically upwardly from the bottom portion 12b. The plate 22 also serves as a radio frequency electrode. The plate 22 is electrically connected to a radio frequency power supply RFG configured to generate a radio frequency bias power via a matching unit MU and a power feeding rod PFR. The radio frequency power supply RFG outputs a radio frequency bias power having a predetermined frequency suitable for controlling an energy of ions drawn into the wafer W, for example 13.65 MHz. The matching unit MU accommodates a matcher for impedance matching between the radio frequency power supply RFG side and a load side impedance (e.g., mainly, an electrode, plasma, or a processing container 12). In the matcher, a blocking condenser for self-bias generation is included.

The electrostatic chuck 24 is installed on the top of the plate 22. The electrostatic chuck 24 includes a base plate 24a and a chuck portion 24b. The base plate 24a is a metallic member having substantially a disc shape and is formed of, for example, aluminum. The base plate 24a is installed on the plate 22. The chuck portion 24b is provided on the top surface of the base plate 24a. The top surface of the chuck portion 24b becomes a mounting region MR on which the wafer W is placed. The chuck portion 24b holds the wafer by an electrostatic attractive force. The chuck portion 24b includes an electrode film sandwiched between dielectric films. A direct current (DC) power supply DSC is electrically connected to the electrode film of the chuck portion 24b via a switch SW and a coated wire CL. The chuck portion 24b may attract and hold the wafer W on the top surface thereof by a Coulomb force generated by a DC voltage applied from the DC power supply DSC. A focus ring FR is installed radially outside of the chuck portion 24b to annularly surround the edge of the wafer W.

In addition, the plasma processing apparatus 10 is provided with a temperature control mechanism. As a portion of the temperature control mechanism, an annular coolant chamber 24g extending in the circumferential direction is provided inside of the base plate 24a. A coolant with a predetermined temperature such as, for example, cooling water is supplied to the coolant chamber 24g from a chiller unit through pipes PP1 and PP3 to be circulated. The processing temperature of the wafer W on the chuck portion 24b may be controlled by the temperature of the coolant. In addition, a heat transfer gas from a heat transfer gas supply module, for example, He gas is supplied to a gap between the top surface of the chuck portion 24b and the rear surface of the wafer W through a supply pipe PP2.

The plasma processing apparatus 10 may further include heaters HT, HS, HC, and HE as a portion of the temperature control mechanism. The heater HT is installed within the ceiling portion 12c and extends annularly to surround the antenna 14. In addition, the heater HS is installed within the side wall 12a and extends annularly. The heater HC is installed within the base plate 24a. The heater HC is installed below the central portion of the above-described mounting region MR within the base plate 24a, i.e. in a region crossing the axis Z. Further, the heater HE is installed within the base plate 24a and extends annularly to surround the heater HC. The heater HE is installed below the outer peripheral edge of the above-described mounting region MR.

Further, an annular exhaust path VL is formed around the mounting table 20. In the middle of the exhaust path VL in the axis Z direction, an annular baffle plate 26 is installed in which a plurality of through holes is formed in the baffle plate 26. The exhaust path VL is connected to an exhaust pipe 28 that provides an exhaust port 28h. The exhaust pipe 28 is mounted in the bottom portion 12b of the processing container 12. An exhaust apparatus 30 is connected to the exhaust pipe 28. The exhaust apparatus 30 includes a pressure regulator and a vacuum pump such as, for example, a turbo molecular pump. By the exhaust apparatus 30, the processing space S within the processing container 12 may be decompressed to a desired vacuum level. In addition, when the exhaust apparatus 30 is operated, the gas may be discharged through the exhaust path VL from the outer periphery of the mounting table 20.

In addition, the plasma processing apparatus 10 further includes a plasma generation unit PG of an exemplary embodiment. The plasma generation unit PG includes an antenna 14, a coaxial waveguide 16, a dielectric window 18, a microwave generator 32, a tuner 34, a waveguide 36, and a mode converter 38. The microwave generator 32 generates microwaves having a frequency of, for example, 2.45 GHz. The microwave generator 32 is connected to an upper portion of the coaxial waveguide 16 via the tuner 34, the waveguide 36, and the mode converter 38. The coaxial waveguide 16 extends along the axis Z which is the central axis thereof. In an exemplary embodiment, the center of the mounting region MR of the mounting table 20 is positioned on the axis Z.

The coaxial waveguide 16 includes an outer conductor 16a and an inner conductor 16b. The outer conductor 16a has a cylindrical shape extending along the axis Z which is the central axis thereof. The lower end of the outer conductor 16a may be electrically connected to an upper portion of the cooling jacket 40 having a conductive surface. The inner conductor 16b is installed inside of the outer conductor 16a to be coaxial to the outer conductor 16a. The inner conductor 16b has a cylindrical shape extending along the axis Z which is the central axis thereof. The lower end of the inner conductor 16b is connected to a slot plate 44 of the antenna 14.

In an exemplary embodiment, the antenna 14 is a radial line slot antenna. The antenna 14 is disposed within the opening formed in the ceiling portion 12c and installed above the top surface of the dielectric window 18. The antenna 14 includes a dielectric plate 42 and a slot plate 44. The dielectric plate 42 shortens the wavelength of microwaves and has substantially a disc-shape. The dielectric plate 42 is formed of, for example, quartz or alumina. The dielectric plate 42 is sandwiched between the slot plate 44 and the bottom surface of the cooling jacket 40. Accordingly, the antenna 14 may be configured by the dielectric plate 42, the slot plate 44, and the cooling jacket 40.

Figure 8:
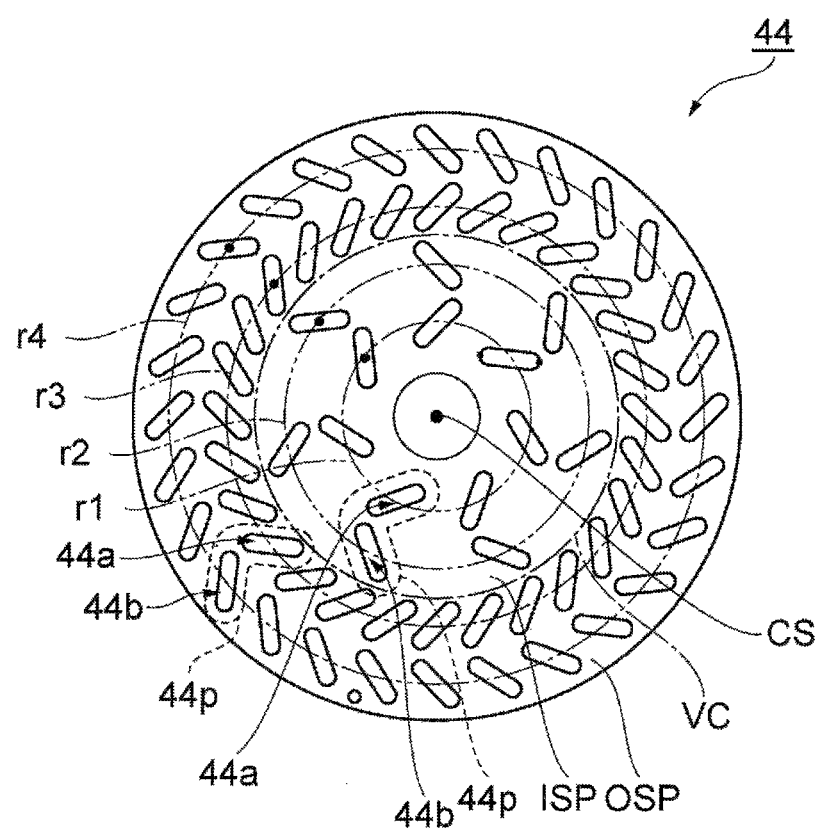
FIG. 8 is a plan view illustrating an exemplary slot plate.

FIG. 8 is a plan view illustrating an exemplary slot plate. The slot plate 44 is formed in a thin disc shape. Each of the opposite surfaces of the slot plate 44 in the thickness direction is flat. The center CS of the circular slot plate 44 is positioned on the axis Z. The slot plate 44 is provided with a plurality of slot pairs 44*p*. Each of the plurality of slot pairs 44*p* includes two slot holes 44*a* and 44*b* penetrating the slot plate in the thickness direction. Each of the slot holes 44*a* and 44*b* has an oblong hole shape. In each slot pair 44*p*, the direction where the major axis of the slot hole 44*a* extends and the direction where the major axis of the slot hole 44*b* extends intersect with each other or lie at right angles to each other.

In the example illustrated in FIG. 8, the plurality of slot pairs 44*p* is generally classified into an inner slot pair group ISP provided inside of a virtual circle VC centering around the axis Z and an outer pair group OSP provided outside of the virtual circle VC. The inner slot pair group ISP includes a plurality of slot pairs 44*p*. In the example illustrated in FIG. 8, the inner slot pair group ISP includes seven (7) slot pairs 44*p*. The plurality slot pairs 44*p* of the inner slot pair group ISP is arranged at regular intervals in a circumferential direction with respect to the center CS. The plurality slot holes 44*a* included in the inner slot pair group ISP is arranged at regular intervals such that the center of gravity of each of the slot holes 44*a* is positioned on a circle with a radius r1 from the center CS of the slot plate 44. In addition, the plurality of slot holes 44*b* included in the inner slot pair group ISP are arranged at regular intervals such that the center of gravity of each of the slot holes 44*b* is positioned on a circle with a radius r2 from the center CS of the slot plate 44. Here, the radius r2 is larger than the radius r1.

The outer slot pair group OSP includes a plurality of slot pairs 44*p*. In the example illustrated in FIG. 8, the outer slot pair group OSP includes twenty eight (28) slot pairs 44*p*. The plurality of slot pairs 44*p* of the outer slot pair group OSP is arranged at regular intervals in the circumferential direction with respect to the center CS. The plurality of slot holes 44*a* included in the outer slot pair group OSP is arranged at regular intervals such that the center of gravity of each of the slot holes 44*a* is positioned on a circle with a radius r3 from the center CS of the slot plate 44. In addition, the plurality of slot holes 44*b* included in the outer slot pair group OSP is arranged at regular intervals such that the center of gravity of each of the slot holes 44*b* is positioned on a circle with a radius r4 from the center CS of the slot plate 44. Here, the radius r3 is larger than the radius r2, and the radius r4 is larger than the radius r3.

In addition, the slot holes 44*a* of the inner slot pair group ISP and the outer slot pair group OSP are formed such that an angle of the major axis of each slot hole 44*a* with respect to a line segment connecting the center CS and the center of gravity thereof is the same as an angle of the major axis of any other slot hole 44*a* with respect to a line segment connecting the center CS and the center of gravity thereof. Further, the slot holes 44*b* of the inner slot pair group ISP and the outer slot pair group OSP are formed such that an angle of the major axis of each slot hole 44*b* with respect to a line segment connecting the center CS and the center of gravity thereof is the same as an angle of the major axis of any other slot hole 44*b* with respect to a line segment connecting the center CS and the center of gravity thereof.

Figure 9:
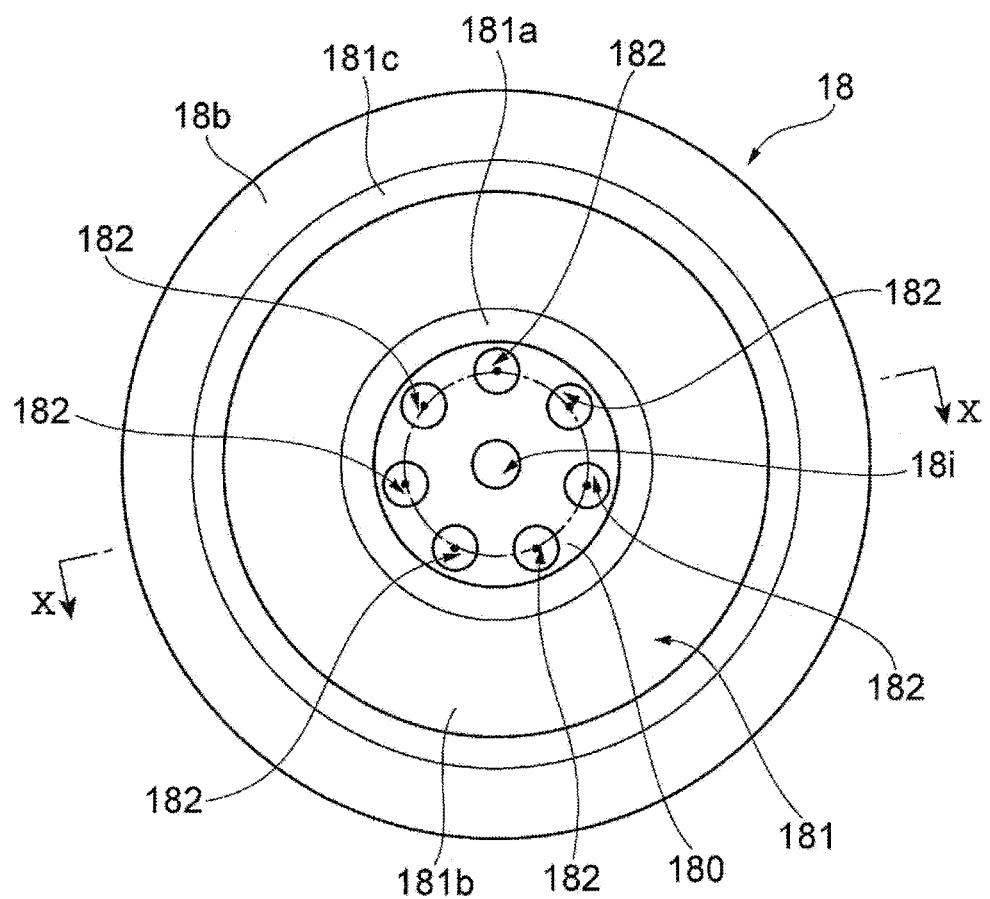
FIG. 9 is a plan view illustrating an exemplary dielectric window.
Figure 10:
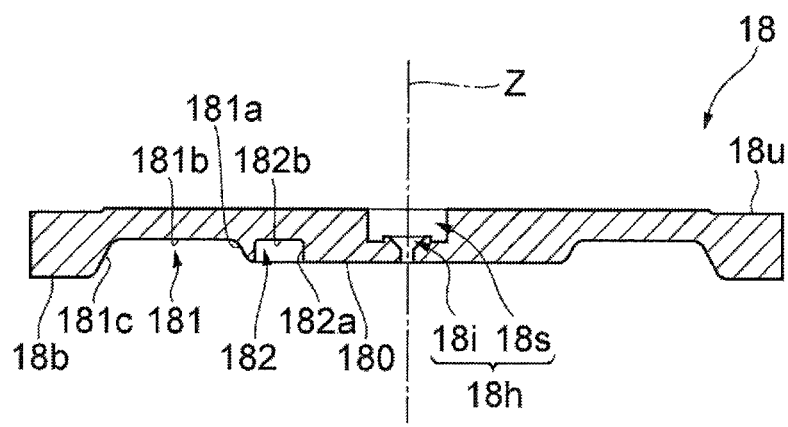
FIG. 10 is a cross-sectional view taken along line X-X in FIG. 9.

FIG. 9 is a plan view illustrating an exemplary dielectric window which is viewed from the processing space S side. FIG. 10 is a cross-sectional view taken along line X-X in FIG. 9. The dielectric window 18 has substantially a disc shape and is formed of a dielectric material such as, for example, quartz or alumina. The slot plate 44 is installed on the top surface 18*u* of the dielectric window 18.

A through hole 18*h* is formed at the center of the dielectric window 18. The upper portion of the through hole 18*h* is a space 18*s* where an injector 50*b* of the central introduction section 50 to be described later is accommodated, and the lower portion is a central introduction port 18*i* of the central introduction section 50 to be described later. Meanwhile, the central axis of the dielectric window 18 coincides with the axis Z.

The surface opposite to the top surface 18*u* of the dielectric window, i.e. the bottom surface 18*b* is in contact with the processing space S, and becomes the surface facing the side where the plasma is generated. The bottom surface 18*b* defines various shapes. Specifically, the bottom surface 18*b* has a flat surface 180 in the central region surrounding the central introduction port 18*i*. The flat surface 180 is orthogonal to the axis Z. In a region radially outside of the flat surface 180, the bottom surface 18*b* defines a first recess 181 which is formed in an annular shape to be continuous annularly and recessed in a tapered shape toward the inside in the thickness direction of the dielectric window 18.

The first recess 181 is defined by the inner tapered surface 181*a*, a bottom surface 181*b*, and an outer tapered surface 181*c*. The bottom surface 181*b* is formed to be closer to the top surface 18*u* side than the flat surface 180, and extends annularly in parallel to the flat surface 180. The inner tapered surface 181*a* extends annularly between the flat surface 180 and the bottom surface 181*b* and is inclined with respect to the flat surface 180. The outer tapered surface 181*c* extends between the bottom surface 181*b* and the peripheral edge of the bottom surface 18*b* and is inclined with respect to the bottom surface 181*b*. Meanwhile, the peripheral edge region of the bottom surface 18*b* becomes a surface to be in contact with the side wall 12*a*.

In addition, the bottom surface 18*b* defines a plurality of second recesses 182 which is recessed toward the inside in the thickness direction from the flat surface 180. The number of the plurality of second recesses 182 is seven (7) in the example illustrated in FIGS. 9 and 10. The plurality of second recesses 182 is formed at regular intervals along the circumferential direction. Further, each of the plurality of second recesses 182 has a circular plan shape in a plane orthogonal to the axis Z. Specifically, an inner surface 182*a* defining each second recess 182 is a cylindrical surface extending in the axis Z direction. Further, the bottom surface 182*b* defining each second recess 182 is a circular surface which is formed to be closer to the top surface 18*u* side than the flat surface 180 and parallel to the flat surface 180.

Figure 11:
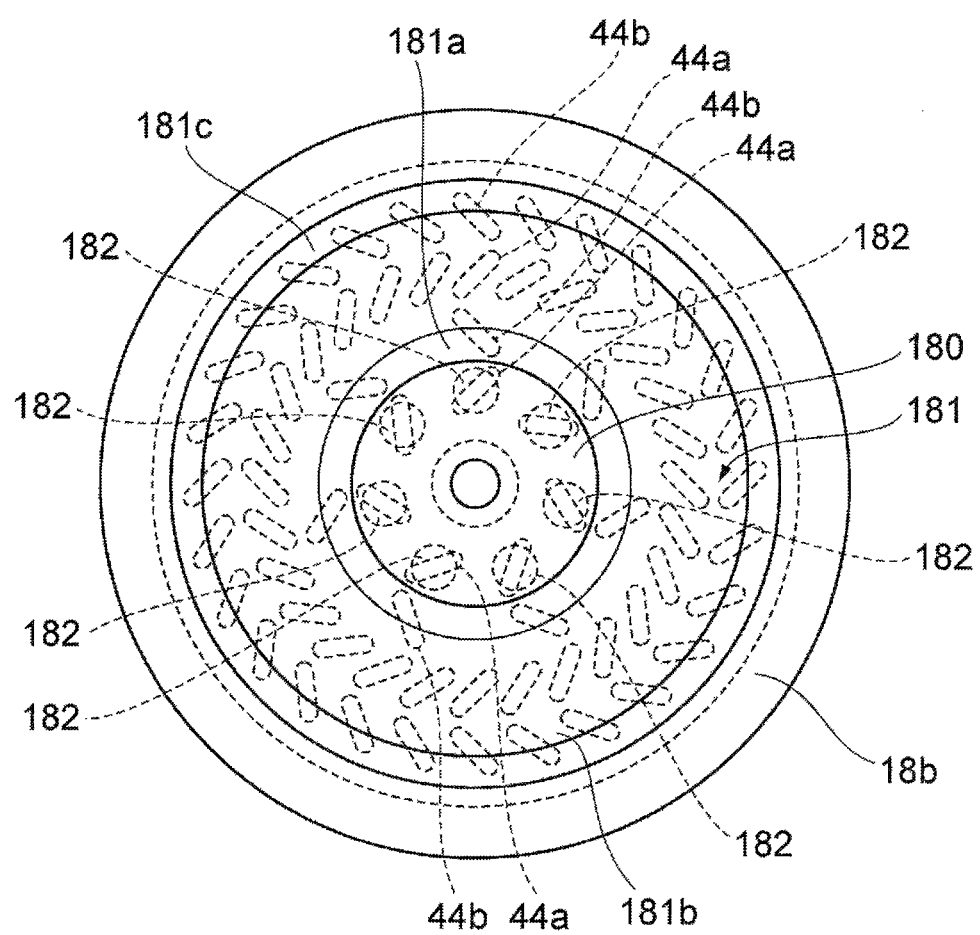
FIG. 11 is a plan view illustrating a state in which the slot plate illustrated in FIG. 8 is installed on the dielectric window illustrated in FIG. 9.

FIG. 11 is a plan view illustrating a state where the slot plate illustrated in FIG. 8 is installed on the dielectric window illustrated in FIG. 9, in which the dielectric window 18 is viewed from the lower side. As illustrated in FIG. 11, in the plan view, i.e., when viewed in the axis Z direction, the plurality of slot holes 44*a* and the plurality of slot holes 44*b* of the outer slot pair group OSP, and the plurality of slot holes 44*b* of the inner slot pair group ISP overlap with the first recess 181. Specifically, in the plan view, the plurality of slot holes 44*b* of the outer slot pair group OSP partially overlaps with the outer tapered surface 181*c*, and partially overlaps with the bottom surface 181*b*. In addition, in the plan view, the plurality of slot holes 44*a* of the outer slot pair group OSP overlaps with the bottom surface 181*b*. Further, in the plan view, the plurality of slot holes 44*b* of the inner slot pair group ISP partially overlaps with the inner tapered surface 181*a* and partially overlaps with the bottom surface 181*b*.

In the plan view, i.e. when viewed in the axis Z direction, the plurality of slot holes 44*a* of the inner slot pair group ISP overlaps with the second recess 182. Specifically, in the plan view, the center of gravity (center) of the bottom surface of each of the second recesses 182 is configured to be positioned within one of the plurality of slot holes 44a of the inner slot pair group ISP.

Referring back to FIG. 7, in the plasma processing apparatus 10, the microwaves generated by the microwave generator 32 are propagated to the electric plate 42 through the coaxial waveguide 16 and given from the slot holes 44a and 44b of the slot plate 44 to the dielectric window 18.

In the dielectric window 18, the plate thickness in the portion defining the first recess 181 and the plate thickness of the portion defining the second recess 182 are formed to be thinner than other portions. Accordingly, in the dielectric window 18, the permeability of microwaves is increased in the portion defining the first recess 181 and the portion defining the second recess 182. In addition, when viewed in the axis Z direction, the slot holes 44a and 44b of the outer slot pair group OSP and the slot holes 44b of the inner slot pair group ISP overlap with the first recess 181, and the slot holes 44a of the inner slot pair group ISP overlap with the second recess 182. Accordingly, the electric field of the microwaves is concentrated to the first recess 181 and the second recess 182 and the energy of the microwaves is concentrated to the first recess 181 and the second recess 182. As a result, plasma may be stably generated in the first recess 181 and the second recess 182 so that plasma distributed in the radial direction and in the circumferential direction just below the dielectric window 18 may be stably generated.

In addition, the plasma processing apparatus 10 further include a central introduction section 50 and a peripheral introduction section 52. The central introduction section 50 includes a duct 50a, an injector 50b, and a central introduction port 18i. The duct 50a is configured to communicate with an inner bore of the inner conductor 16b of the coaxial waveguide 16. In addition, an end of the duct 50a extends to the inside of a space 18a defined by the dielectric window 18 along the axis Z (see, e.g., FIG. 10). The injector 50b is accommodated within the space 18s and below the end of the duct 50a. A plurality of through holes extending in the axis Z direction is formed in the injector 50b. In addition, the dielectric window 18 defines the central introduction port 18i. The central introduction port 18i is continuous to the lower side of the space 18s and extends along the axis Z. The central introduction section 50 with this configuration supplies a gas to the injector 50b through the duct 50a, and jets the gas from the injector 50b through the central injection port 18i. In this manner, the central introduction section 50 jets the gas just below the dielectric window 18 along the axis Z. That is, the central introduction section 50 introduces the gas into a plasma generation region with a high electron temperature.

The peripheral introduction section 52 includes a plurality of peripheral introduction ports 52i. The plurality of peripheral introduction ports 52i supplies the gas mainly to the edge region of the wafer W. The plurality of peripheral introduction ports 52i is opened toward the edge region of the wafer W or the peripheral edge of the mounting region MR. The plurality of peripheral introduction ports 52i is arranged along the circumferential direction below the central introduction port 18i and above the mounting table 20. That is, the plurality of peripheral introduction ports 52i is arranged annularly around the axis Z in a region (plasma diffusion region) having an electron temperature lower than that just below the dielectric window 18. The peripheral introduction section 52 supplies the gas toward the wafer W from the region with the lower electron temperature. Accordingly, the dissociation degree of the gas introduced into the processing space S from the peripheral introduction section 52 is suppressed as compared to the dissociation degree of the gas supplied to the processing space S from the central introduction section 50.

Figure 12:
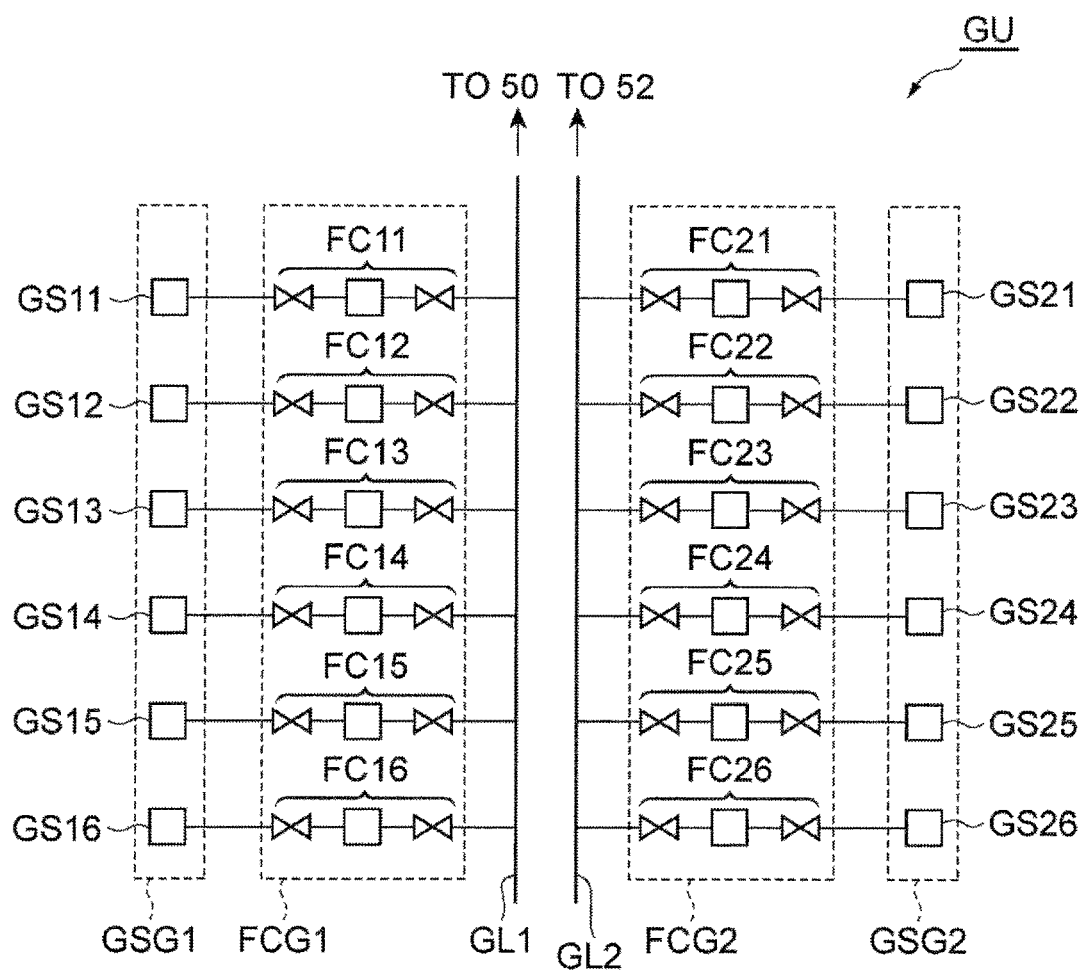
FIG. 12 is a view illustrating a gas supply module including a first flow rate control unit group, a first gas source group, a second flow rate control unit group, and a second gas source group.

To the central introduction section 50, a first gas source group GSG1 is connected via a first flow rate control unit group FCG1. In addition, to the peripheral introduction section 52, a second gas source group GSG2 is connected via a second flow rate control unit group FCG2. FIG. 12 is a view illustrating a gas supply module including the first flow rate control unit group, the first gas source group, the second flow rate control unit group, and the second gas source group. As illustrated in FIG. 12, the first gas source group GSG1, the first flow rate control unit group FCG1, the second gas source group GSG2, and the second flow rate control unit group FCG2 form a gas supply module GU of an exemplary embodiment.

The first gas source group GSG1 includes a plurality of first gas sources GS11 to GS16. The gas source GS11 is a source of a gas containing hydrogen, for example, a source of $H_2$ gas. The gas source GS12 is a source of a gas containing nitrogen, for example, a source of $N_2$ gas. The gas source GS13 is a source of a gas containing fluorine. As for the gas containing fluorine, at least one of fluorocarbon gas, fluorohydrocarbon gas, $NF_3$ gas, and $SF_6$ gas as described above may be used. The gas source GS11, the gas source GS12, and the gas source GS13 are gas sources of the first processing gas of the exemplary embodiment. The gas source GS14 is a source of a rare gas, for example, a source of Ar gas. In addition, the gas source GS15 is a gas source of HBr gas described above. Further, the gas source GS16 is a source of $O_2$ gas. The gas source GS15 is a source of a gas forming the second processing gas of the exemplary embodiment.

The first flow rate control unit group FCG1 includes a plurality of first flow rate control units FC11 to FC16. Each of the plurality of first flow rate control units FC11 to FC16 includes, for example, two valves, and a flow rate controller installed between the two valves. The flow rate controller is, for example, a mass flow controller. The plurality of first gas sources GS11 to GS16 is connected to the common gas line GL1 via the plurality of first flow rate control units FC11 to FC16, respectively. The common gas line GL1 is connected to the central introduction section 50.

The second gas source group GSG2 includes a plurality of first gas sources GS21 to GS26. The second gas sources GS21 to GS26 are the sources of gases which are the same kind as those of the gas sources GS11 to GS16, respectively.

The second flow rate control unit group FCG2 includes a plurality of second flow rate control units FC21 to FC26. Each of the plurality of second flow rate control units FC21 to FC26 includes, for example, two valves, and a flow rate controller installed between the two valves. The flow rate controller is, for example, a mass flow controller. The plurality of second gas sources GS21 to GS26 is connected to a common gas line GL2 via the plurality of second flow rate control units FC21 to FC26, respectively. The common gas line GL2 is connected to the peripheral introduction section 52.

As described above, in the plasma processing apparatus 10, a plurality of first gas sources and a plurality of first flow rate control units are provided exclusively for the central introduction section 50, and a plurality of second gas sources and a plurality of second flow rate control units which are independent from the first gas sources and the plurality of first flow rate control units are provided exclusively for the peripheral introduction section 52. Accordingly, the kind of the gases introduced into the processing space S from the central introduction section 50, and the flow rates of one or more of the gases introduced into the processing space S from the central introduction section 50 may be independently controlled, and the kind of the gases introduced into the processing space S from the peripheral introduction section 52 and the flow rates of one or more of the gases introduced into the processing space S from the peripheral introduction section 52 may be independently controlled.

In an exemplary embodiment, the peripheral introduction section 52 further includes an annular pipe 52p. The pipe 52p is formed with a plurality of peripheral introduction ports 52i. The annular pipe 52p may be formed of, for example, quartz. As illustrated in FIG. 7, in the exemplary embodiment, the annular pipe 52p is installed along the inner wall surface of the side wall 12a. In other words, the annular pipe 52p is not disposed on a route that connects the bottom surface of the dielectric window 18 and the mounting region MR, that is, the wafer W. Accordingly, the annular pipe 52p does not disturb the diffusion of plasma. In addition, since the annular pipe 52p is installed along the inner wall surface of the side wall 12a, the consumption of the annular pipe 52p by plasma is suppressed, and as a result, the exchange frequency of the annular pipe 52p can be reduced. Further, since the annular pipe 52p is installed along the side wall 12a, of which the temperature may be controlled by a heater, the temperature stability of a gas introduced into the processing space S from the peripheral introduction section 52 can be improved.

In the exemplary embodiment, the plurality of peripheral introduction ports 52i is opened toward the edge area of the wafer W. That is, the plurality of peripheral introduction ports 52i is inclined with respect to a plane orthogonal to the axis Z so as to jet a gas toward the edge region of the wafer W. Since the peripheral introduction ports 52i are opened to be inclined toward the edge region of the wafer W as described above, the active species of the gas jetted from the peripheral introduction ports 52i is directly directed to the edge region of the wafer W. As a result, the active species of the gas can be supplied to the edge of the wafer W without being deactivated.

The plasma processing apparatus 10 further includes a control unit Cnt. The control unit Cnt may be a controller such as, for example, a programmable computer device. The control unit Cnt may control each component of the plasma processing apparatus 10 according to a program based on a recipe.

When step ST1 of method MT is performed, the control unit Cnt executes a control of causing the gas supply module GU to supply the first processing gas and causing the plasma generation unit PG to generate energy. With this control, the gas supply module GU supplies a mixed gas of the gases from the gas sources GS11, GS12, GS13, GS21, GS22, and GS23 into the processing container 12 as the first processing gas. In addition, with this control, the plasma generation unit PG introduces microwaves into the processing container 12 through the dielectric window 18. Thus, the plasma of the first processing gas is generated, and the wafer W is exposed to the plasma. According to an exemplary embodiment, in this control, the control unit Cnt may stop the supplying of a radio frequency bias power from the radio frequency power supply RFG to the plate 22, that is, the radio frequency electrode.

In addition, when performing step ST2 of method MT, the control unit Cnt executes a control of causing the gas supply module GU to supply a rare gas, and causing the plasma generation unit PG to generate energy. With this control, the gas supply module GU supplies the rare gas from the gas source GS14 and the gas source GS24 into the processing container 12. In addition, with this control, the plasma generation unit PG introduces microwaves into the processing container 12 through the dielectric window 18. Thus, the plasma of the rare gas is generated, and the wafer W is exposed to the plasma. According to an exemplary embodiment, in this control, the control unit Cnt may stop the supplying of a radio frequency bias power from the radio frequency power supply RFG to the plate 22, that is, the radio frequency electrode.

When step ST3 of method MT is performed, the control unit Cnt executes a control of causing the gas supply module GU to supply the second processing gas and causing the plasma generation unit PG to generate energy. With this control, the gas supply module GU supplies a mixed gas of the gases from, for example, the gas sources GS14, GS15, GS16, GS24, GS25, and GS26 into the processing container 12 as the second processing gas. In addition, with this control, the plasma generation unit PG introduces microwaves into the processing container 12 through the dielectric window 18. Thus, the plasma of the second processing gas is generated and the wafer W is exposed to the plasma. According to an exemplary embodiment, in this control, the control unit Cnt may control the radio frequency power supply RFG such that a radio frequency bias power is supplied from the radio frequency power supply RFG to the plate 22, that is, the radio frequency electrode.

When steps ST2 and ST3 of the method according to the other exemplary embodiment described above with reference to FIGS. 6A and 6B are performed, the control unit Cnt executes a control of causing the gas supply module GU to supply the second processing gas, and causing the plasma generation unit PG to generate energy. With this control, the gas supply module GU supplies a mixed gas of the gases from, for example, the gas source GS14, GS15, GS16, GS24, GS25, and GS26 into the processing container 12 as the second processing gas. In addition, with this control, the plasma generation unit PG introduces microwaves into the processing container 12 through the dielectric window 18. Thus, the plasma of the second processing gas is generated, and the wafer W is exposed to the plasma. In addition, in this control, the control unit may perform steps ST2 and ST3 by not supplying the bias power for a predetermined period from the initiation of this control, and supplying the bias power after the predetermined period elapses.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container including a side wall, a bottom portion, and a ceiling portion;
a mounting table configured to mount an object to be processed thereon within the processing container, the object including a silicon layer and a mask formed thereon;
a gas supply module configured to supply a first processing gas, a rare gas, and a second processing gas for etching a silicon layer into the processing container, the first processing gas comprising hydrogen, nitrogen and fluorine;

a plasma generation unit configured to generate energy to excite a gas supplied into the processing container; and a control unit configured to control the gas supply module and the plasma generation unit, wherein the control unit is configured to perform:

(i) a first control that causes the gas supply module to supply the first processing gas, causes the plasma generation unit to generate plasma of the first processing gas comprising hydrogen, nitrogen and fluorine, and denatures an oxide layer formed separately on the silicon layer along with a top surface and a side surface of the mask to form a denatured region by the plasma of the first processing gas within the processing container, (ii) a second control that causes the gas supply module to supply the rare gas, causes the plasma generation unit to generate plasma of the rare gas, and removes the denatured region by the plasma of the rare gas within the processing container, (iii) after the first control and the second control, a third control that causes the gas supply module to supply the second processing gas, causes the plasma generation unit to generate plasma of the second processing gas, and etches the silicon layer with the plasma of the second processing gas within the processing container, and (iv) a sequential execution of the first control, the second control, and the third control within the processing container without taking out the object from the processing container.

2. The plasma processing apparatus of claim 1, wherein a bias power is not supplied to the mounting table during the first control and the second control.

3. The plasma processing apparatus of claim 1, wherein the first processing gas includes $SF_6$ gas.

4. The plasma processing apparatus of claim 1, further comprising:

a dielectric window sandwiched between an upper wall of the side wall and the ceiling portion; and a slot plate provided on a top surface of the dielectric window to have a plurality of slot pairs classified into an inner slot pair group (ISP) and an outer slot pair group (OSP), each of the ISP and the OSP including an inner slot hole and an outer slot hole penetrating the slot plate in a thickness direction.

5. The plasma processing apparatus of claim 4, wherein the dielectric window includes:

a first recess formed on a bottom surface thereof having a flat surface in an annular shape to be continuous annularly and recessed in a tapered shape toward an inside in a thickness direction thereof; and a plurality of second recesses recessed toward an inside in a thickness direction thereof and formed at regular intervals along a circumferential direction of the flat surface.

6. The plasma processing apparatus of claim 5, wherein the inner and outer slot holes of the OSP and the outer slot holes of the ISP overlap with the first recess, and each of the inner slot holes of the ISP overlaps with each of the second recesses.

7. The plasma processing apparatus of claim 1, wherein the second processing gas includes HBr gas.

* * * * *